(12) United States Patent  (10) Patent No.: US 7,803,515 B2
Hirai et al.  (45) Date of Patent: Sep. 28, 2010

(54) FILM PATTERN FORMING METHOD, DEVICE, ELECTRO-OPTICAL APPARATUS, AND ELECTRONIC APPLIANCE

(75) Inventors: Toshimitsu Hirai, Chino (JP); Katsuyuki Moriya, Azumino (JP)

(73) Assignee: Seiko Epson Corporation (JP)

( * ) Notice: Subject to any disclaimer, the term of this patent is extended or adjusted under 35 U.S.C. 154(b) by 883 days.

(21) Appl. No.: 11/556,384

(22) Filed: Nov. 3, 2006

(65) Prior Publication Data

US 2007/0117233 A1 May 24, 2007

(30) Foreign Application Priority Data

Nov. 4, 2005 (JP) .............................. 2005-320457

(51) Int. Cl.
    *H01L 21/00* (2006.01)
(52) U.S. Cl. ........................ 430/311; 430/314; 430/322
(58) Field of Classification Search ................. 430/311, 430/314, 322; 438/22, 584, 665, 674
    See application file for complete search history.

(56) References Cited

U.S. PATENT DOCUMENTS

2005/0022374 A1 * 2/2005 Hirai et al. .................... 29/825

FOREIGN PATENT DOCUMENTS

| JP | 11-274671    | 10/1999 |
|----|--------------|---------|
| JP | 2000-216330  | 8/2000  |
| JP | 2005-12181   | 1/2005  |
| JP | 2005-128409  | 5/2005  |
| JP | 2005-167228  | 6/2005  |
| JP | 2005-210083  | 8/2005  |

* cited by examiner

*Primary Examiner*—Thorl Chea
(74) *Attorney, Agent, or Firm*—Harness, Dickey & Pierce, P.L.C.

(57) ABSTRACT

A method for forming a film pattern by disposing a functional fluid on a substrate, includes: forming a partition wall that includes a first opening that corresponds to a first film pattern and a second opening that corresponds to a second film pattern; and disposing a droplet of the functional fluid into the first opening, so that the functional fluid is disposed into the second opening by a self-flow of the functional fluid; wherein: the first film pattern is linear; the second film pattern is narrower than the first film pattern, and is connected to the first film pattern at a rear edge thereof; and a front edge of the second film pattern has a missing part in which a corner of a rectangular contour is missing.

4 Claims, 11 Drawing Sheets

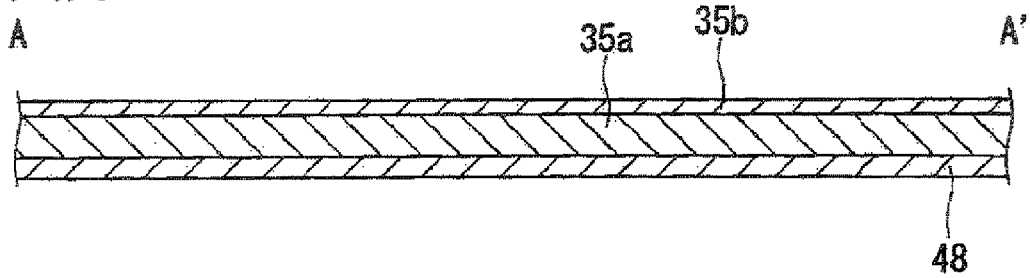
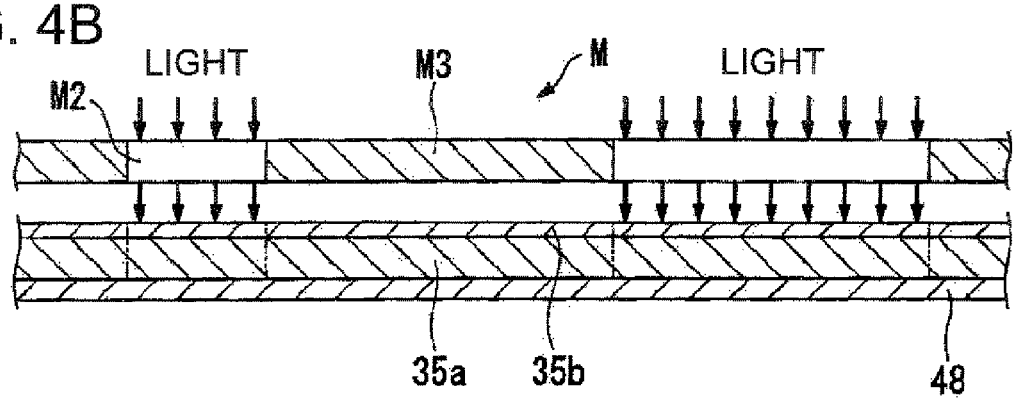
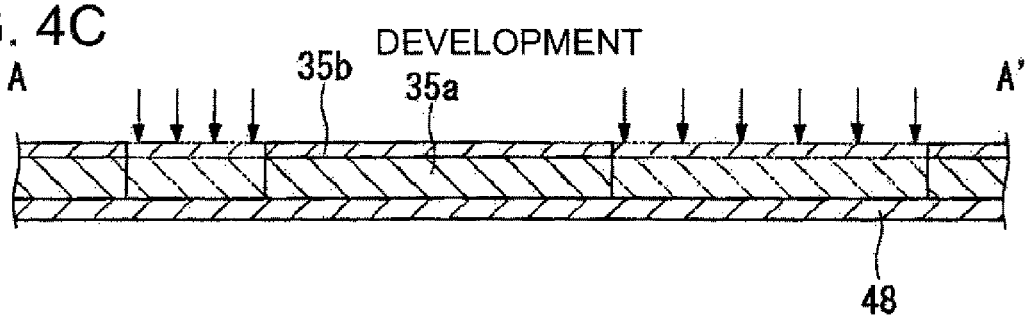
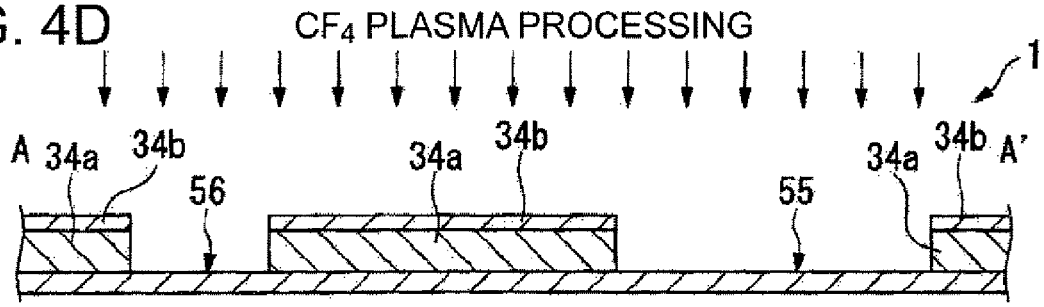
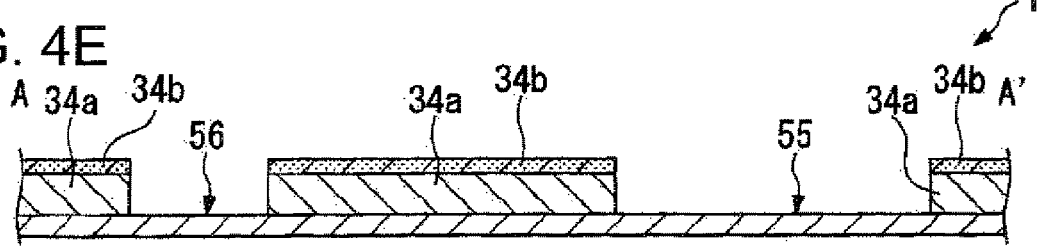

FIG. 7

FILM PATTERN FORMING METHOD, DEVICE, ELECTRO-OPTICAL APPARATUS, AND ELECTRONIC APPLIANCE

BACKGROUND

1. Technical Field

The present invention relates to a film pattern forming method, a device, electro-optical apparatus, and an electronic apparatus.

2. Related Art

A method such as photolithography is widely utilized as a method for forming a predetermined patterned wiring and other elements that are used for an electronic circuit, an integrated circuit or the like. The photolithography requires large-scale equipments such as a vacuum apparatus and an aligner. Moreover, there are problems such as: those equipments requiring complex processes in order to form wirings and other elements that are constituted of predetermined patterns; and the manufacturing cost being high, since the material usage efficiency is approximately several percents, most of the materials unavoidably being disposed.

Compared with the above, a droplet discharge method, or, a so-called inkjet method has been suggested for forming the wirings and other elements that are constituted of the predetermined patterns on a substrate, the droplet discharge method discharging the liquid material from the liquid discharge head in droplets (for example, refer to JP-A-11-274671 and JP-A-2000-216330). In the inkjet method, a liquid material (functional fluid) for patterning is deposited in patterns directly on a substrate, thereafter, a heat treatment or a laser illumination is carried out and thus a desired pattern is formed. This method makes a photolithography unnecessary, significantly simplifying the process, and reduces the usage volume of the raw material since the material is directly deposited on the pattern location.

In recent years, circuits constituting devices are increasingly produced in a high-density, demanding a further miniaturization and thinning of, for instance, wirings. However, in a pattern forming method using the droplet discharge method described above, the discharged droplets spread out on a substrate after the landing, making it difficult to stably form the minute patterns. Especially when the pattern is a conductive film, the spread droplets cause liquid retention pits (bulges), possibly resulting to be a cause of defects such as disconnection and short circuit. Given this factor, a technique which uses a bank structure has been suggested, where the bank structure includes: a wide wiring-formation region; and a minute wiring-formation region that is formed being connected to the wide wiring-formation region (for example, refer to JP-A-2005-12181). In this technique, the functional fluid is discharged onto the wide wiring-formation region, and is made to flow into the minute wiring-formation region resulting from a self-flow of the capillary phenomenon.

The common technique described above, however, involves the following problem.

In order to stably form minute wiring patterns, it is critical to make the length, into which the droplets are flown in, short (i.e., to make the area small), while a certain length is required for fulfilling a prescribed function, and cannot be shortened more than is necessary.

SUMMARY

The advantage of the invention is to provide a film pattern forming method that stably forms a pattern while maintaining a prescribed function, as well as to provide a device, an electro-optical apparatus, and an electronic apparatus that are produced using the method.

In order to achieve the above-referenced advantage, each aspect of the present invention is provided as follows.

According to a first aspect of the invention, a method for forming a film pattern by disposing a functional fluid on a substrate, includes: forming a partition wall that includes a first opening that corresponds to a first film pattern and a second opening that corresponds to a second film pattern; and disposing a droplet of the functional fluid into the first opening, so that the functional fluid is disposed into the second opening by a self-flow of the functional fluid; wherein: the first film pattern is linear; the second film pattern is narrower than the first film pattern, and is connected to the first film pattern at a rear edge thereof; and a front edge of the second film pattern has a missing part in which a corner of a rectangular contour is missing.

Therefore, in the film pattern forming method according to the first aspect of the invention, the missing part of the front edge need not have a functional liquid flown in, while the functional fluid are deposited from the first opening into the second opening utilizing the self-flow of the functional fluid. Hence, the flow length is shortened, which allowing a stable film pattern formation. Moreover, the prescribed function is maintained, since, according to this aspect of the invention, the missing part is in the front edge of the second film pattern.

It is desirable that the missing part be shaped in the shape based on the rheological characteristics of the functional fluid. Therefore, according to this aspect of the invention, the time during which the functional fluid is deposited into the second opening in the second film pattern is shortened, by shaping the missing part in accordance with the flow-speed distribution of the functional fluid; thereby improving the productivity.

Moreover, it is desirable that the missing part be formed outside of a functional region in the second film pattern.

According to this aspect of the invention, the film pattern is thereby stably formed, without impairing the prescribed function provided by the second film pattern.

Further, it is suitable that the rear edge of the second film pattern be connected to the first film pattern via a widened part in which the line width expands.

Therefore, according to this aspect of the invention, the functional fluid flows into the second opening from the widened part in which the line width expands. This reduces the flow resistance, and the functional fluid is deposited smoothly into the second opening.

At the same time, according to the second aspect of the invention, a device includes: a first film pattern a shape thereof is linear; and a second film pattern which is narrower than the first film pattern, and is connected to the first film pattern at a rear edge thereof; wherein a front edge of the second film pattern has a missing part in which a corner of a rectangular contour is missing.

Therefore, according to the second aspect of the invention, when forming the second film pattern utilizing the self-flow of the functional fluid, the missing part of the front edge need not have a functional liquid flown in. Hence, the flow length is shortened, which allows the formation of a stable film pattern. Moreover, the prescribed function is maintained, since, according to this aspect of the invention, the missing part is in the front edge of the second film pattern.

It is desirable that the missing part be formed outside of a functional region in the second film pattern.

According to this aspect of the invention, the film pattern is thereby stably formed, without impairing the prescribed function provided by the second film pattern.

Further, it is suitable that the rear edge of the second film pattern be connected to the first film pattern via a widened part in which the line width expands.

In this structure, the functional fluid flows from the widened part in which the line width expands. This reduces the flow resistance and the functional fluid is deposited into the second film pattern formation region.

An electro-optical device according to the third aspect of the invention includes the above-referenced device.

The electro-optical device according to this aspect of the invention includes the device stably formed; hence the electro-optical device with improved performance and quality is realized.

In this aspect of the invention, devices collectively called as the electro-optical devices are: a device that has an electro-optical effect in which the refraction index of a substance changes with an electronic field; and a device that converts the electric energy to the optical energy; and the like. Specifically, such devices may include: a liquid crystal display device that uses the liquid crystal as an electro-optical substance; an organic electro-luminescence (hereafter referred to as "EL") device that uses an electro-optical substance; an inorganic EL device that uses an inorganic EL device; and a plasma display device that uses a gas for plasma as an electro-optical substance. Such devices may also include an electrophoretic display (hereafter referred to as "EPD") device, and a field emission display (hereafter referred to as FED) device.

The electronic apparatus according to the forth aspect of the invention includes the above-referenced electro-optical device.

The electronic apparatus according to this aspect of the invention includes the electro-optical device with improved performance and quality, thereby having a high reliability.

BRIEF DESCRIPTION OF THE DRAWINGS

The invention will be described with reference to the accompanying drawings, wherein like numbers reference like elements.

FIGS. 4A to 4E are sectional side view drawings of a bank structures

FIG. 7 is a drawing schematically showing one pixel which is a display region.

DESCRIPTION OF EXEMPLARY EMBODIMENTS

Embodiments of a film pattern forming method, a device, an electro-optical device, and an electronic apparatus will now be described with references to the accompanying drawings.

The embodiments described hereafter merely represent some of the embodiments for the present invention, and shall not limit the invention. Figures used in the description hereafter have different scale sizes modified for each of the layers and components, so that each of them will have a size large enough to be recognized in the figures.

Droplet Discharge Device

First, according to one embodiment of the invention, a droplet discharge device used for forming film patterns is described with reference to FIG. 1.

Figure 1:
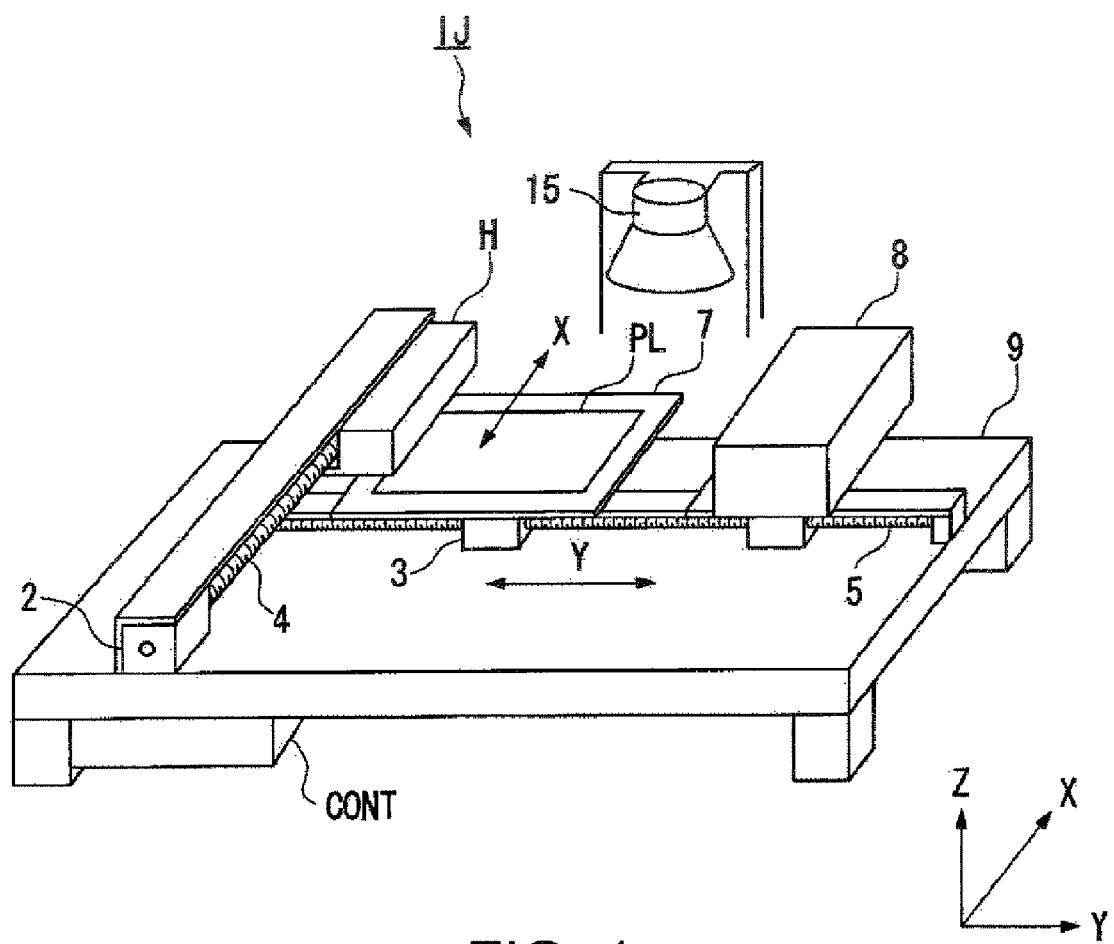
FIG. 1 is an oblique drawing showing a schematic structure of a droplet discharge device according to one aspect of the invention.

FIG. 1 is an oblique drawing showing a schematic configuration of a droplet discharge device (an inkjet device) IJ that deposits a liquid material to a substrate with the droplet discharge method, the device being indicated as an example of a device used in the film pattern forming method in accordance with the embodiment of the invention.

The droplet discharge device IJ includes a droplet discharge head H, a driving X-axis axis 4, a Y-axis direction guide shaft 5, a control device CONT, a stage 7, a cleaning mechanism 8, a bed 9, and a heater 15.

The stage 7 supports a substrate PL on which an ink (liquid material) is arranged by the droplet discharge device IJ. It is equipped with an un-illustrated anchoring mechanism for fixing the substrate PL to a reference position.

The droplet discharge head H is a multi-nozzle droplet discharge head provided with a plurality of discharge nozzles, and the longitudinal direction coincided with the Y-axis. The plurality of discharge nozzles are installed in the Y-axis direction, lined up at intervals, on the inferior surface of the droplet discharge head H. Ink containing the above-referenced minute conductive particles is discharged toward the substrate PL supported by the stage 7, from the discharge nozzles of the droplet discharge head H.

An X-axis direction drive motor 2 is connected to the X-axis direction drive shaft 4. The X-axis direction drive motor 2 is a stepping motor and the like, and revolves the X-axis direction drive shaft 4 when a driving signal of the X-axis direction is supplied from the control device CONT. The droplet discharge head H shifts in the X-axis direction as the X-axis direction drive shaft 4 rotates.

The Y-axis direction guide shaft 5 is fixed so as to make it stationary to with respect to the bed 9. The stage 7 is equipped with a Y-axis direction drive motor 3. The Y-axis direction drive motor 3 is a stepping motor and the like, and shifts the stage 7 in the Y-axis direction, when a driving signal of the Y-axis direction is supplied from the control device CONT.

The control device CONT supplies a voltage for liquid droplet discharge control to the droplet discharge head H. Further, the control device CONT supplies, to the X-axis direction drive motor 2, a drive pulse signal for controlling the shift of the droplet discharge head H in the X-axis direction, and, it further supplies, to the Y-axis direction drive motor 3, a drive pulse signal for controlling the shift of the stage 7 in the Y-axis direction.

The cleaning mechanism 8 cleans the droplet discharge head H, and has an un-illustrated Y-axis direction drive motor. The cleaning mechanism 8 shifts along the Y-axis direction guide shaft 5, driven by the Y-axis direction drive motor The shifting of the cleaning mechanism 8 is also controlled by the control device CONT.

The heater 15 herein provides a method for heat-treating the substrate PL by lamp anneal, conducting evaporation and drying of a solvent contained in the liquid material coated on the substrate PL. The power-on and off of the heater 15 is also controlled by the control device CONT.

The droplet discharge device IJ discharges the droplets onto the substrate PL, while relatively scanning both the droplet discharge head H and the stage 7 that supports the substrate PL. In the description hereafter, the X-axis direction is called as a scanning direction, and the Y-axis direction being orthogonal to the X-axis, is called as a non-scanning direction. The plurality of discharge nozzles of the droplet discharge head H are installed in the Y-axis direction, i.e., in the non-scanning direction, lined up at intervals. Here, in FIG.1, the droplet discharge head H is arranged at a right angle to the advancing direction of the substrate PL. However, the angle of the droplet discharge head H may be adjusted to intersect the advancing direction of the substrate PL. By adjusting the angle of the droplet discharge head H, the pitch between nozzles can be adjusted. Moreover, the distance between the substrate PL and the nozzle surface may be made arbitrarily adjustable.

Figure 2:
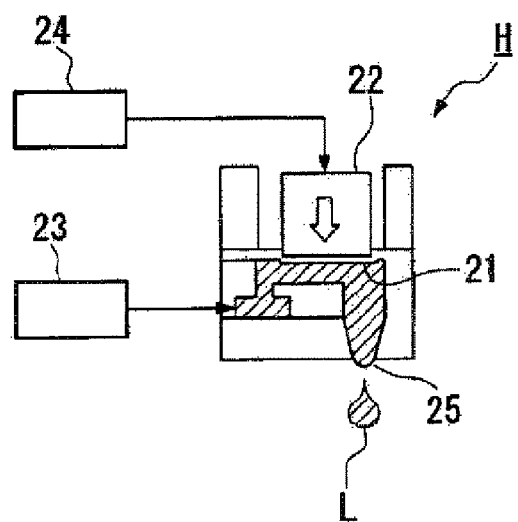
FIG. 2 is a drawing for describing the discharging basis of a liquid material with piezoelectric method.

FIG. 2 is a drawing for describing the discharging basis of a liquid material with piezoelectric method.

As shown in FIG.2, a piezo device 22 is installed being adjacent to a liquid chamber 21 that contains a liquid material (ink for a wiring pattern or functional liquid) L. The liquid material is supplied to the liquid chamber 21 through a liquid material supply system 23 that includes a material tank for containing the liquid material.

The piezo device 22 is connected to a drive circuit 24. By impressing a voltage to the piezo device 22 through this drive circuit 24, and by thereby changing the shape of the piezo device 22, the liquid chamber 21 deforms and the liquid material is discharged from a nozzle 25. Here, the degree of deformation of the piezo device 22 is controlled by changing the value of the applied voltage. Moreover, the deformation speed of the piezo device 22 is controlled by changing the frequency of the applied voltage.

The discharge basis of the liquid material also includes, besides the above-referenced piezoelectric method with which the ink is discharged using the piezo (piezoelectric) device, a various apprehended techniques may be applied, such as: a bubble method with which the liquid material is discharged by a bubble generated by heating the liquid material, and the like. The above-referenced piezo method has the advantage that it has no impact on the composition of the material, since the heat is not applied to the liquid material.

A functional fluid L may be a dispersion whereby the minute conductive particles are dispersed into a dispersion medium, or, a solution whereby the organic silver compound or the silver oxide nano particles are dispersed into a solvent (dispersion medium).

Examples of minute conductive particles may include: metallic minute particles containing any one of gold, silver, copper, palladium, or nickel; oxides thereof; and conductive polymer or minute superconductive particles, etc.

These minute conductive particles may be used with organics and the like, coated on to the surface, in order to improve the dispersiveness.

The grain diameter of the minute conductive particle is desirably between 1 nm and 0.1 µm inclusive. If the size is larger than 0.1 µm, nozzle clogging of a droplet discharge head (described later) may occur. If the size is smaller than 1 nm, a volume ratio of the coating material to the minute conductive particle increases, and the proportion of the organic matter obtained in the film becomes excessive.

Which disperse medium to be used is not specifically limited as long as the minute conductive particles can be dispersed and does not cause coagulation. More specifically, the material, in addition to water, may be illustrated including: alcohols such as methanol, ethanol, propanol, and butanol; hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ether compounds such as ethylene glycol dimethyl ether, ethylene glycol diethyl ether, ethylene glycol ethyl methyl ether, diethylene glycol dimethyl ether, diethylene glycol diethyl ether, diethylene glycol methyl ethyl ether, 1,2-dimethoxyethane, bis(2-methoxyethyl) ether, and p-dioxane; and polar compounds such as propylene carbonate gamma-butyrolactone, N-methyl-2-pyrrolidone, dimethylformamide, dimethyl sulfoxide, and cyclohexanone. Among the above, water, alcohols, hydrocarbon compounds, ether compounds are preferable in terms of dispersibility of minute particles, stability of a dispersed liquid, and ease of application to the liquid droplet discharge method (inkjet method). Water and hydrocarbon compounds may be cited as a more preferable diffusion media Surface tension of the dispersed liquid of the minute conductive particles should preferably be in the range of 0.02N/m and 0.07N/m inclusive. When discharging the fluid with the droplet discharge method, if the surface tension is less than 0.02N/m, the wettability of an ink composition against a surface of the nozzle increases; hence a flight curve tends to occur. If the surface tension exceeds 0.07N/m, then a shape of a meniscus at the nozzle tip does not stabilize; causing the control of the discharge volume and the discharge timing to be difficult. In order to adjust the surface tension, a small amount of surface tension adjustment agent such as fluoride, silicide, and nonionic types may be added into above-referenced dispersed liquid, as long as it does not significantly lower a contact angle with the substrate. The nonionic surface tension adjusting agent contributes to increase the liquid's wetting against the substrate, improving the leveling capacity of the film, and preventing the occurrence of minute concavity and convexity of the film. The surface tension adjusting agent may include, as necessary, an organic compound such as alcohol, ether, ester and ketone.

The viscosity of the dispersion is desirably between 1 mPa·s and 50 mPa·s inclusive. When discharging the liquid material as droplets using the droplet discharge method, if the viscosity is smaller than 1 mPa·s, then the peripheral of the nozzle tends to be contaminated by an outflow of the ink; and if the viscosity is larger than 50 mPa·s, then the clogging frequency of the nozzle hole increases, making the smooth droplet discharge difficult.

Bank Structure

A bank structure to which the functional fluid (ink) is deposited, used in the film pattern forming method in this embodiment, is described with reference to FIGS. 3A and 3B.

Figure 3A:
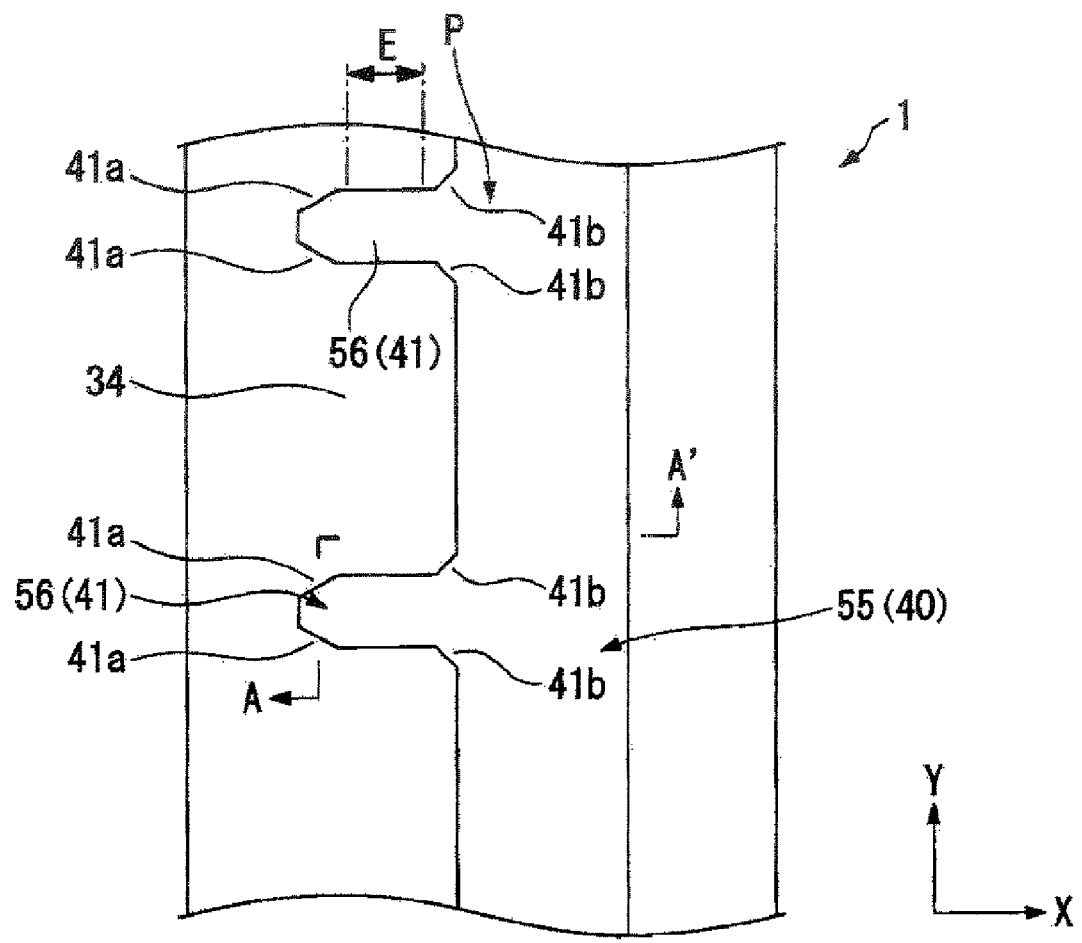
FIG. 3A is a top view drawing of a bank structure.

FIG. 3A is a top view drawing showing the schematic structure of a bank structure 1. FIG. 3B is a sectional side view drawing of the bank structure 1 showing the section A-A' indicated in FIG. 3A. The bank structure 1 according to the embodiment is a bank (partition wall 34 with a predetermined pattern formed on a substrate 48, as shown in FIG. 3A and 3B. A pattern formation region P, i.e., a region for depositing the functional fluid is partitioned, surrounded by the bank 34. The pattern formation region P according to the embodiment is a region provided on the substrate 48 which is for forming a gate electrode and a gate wiring that constitute a thin-film transistor (hereafter referred to as "TFT"). The description thereof will follow later.

Figure 7:
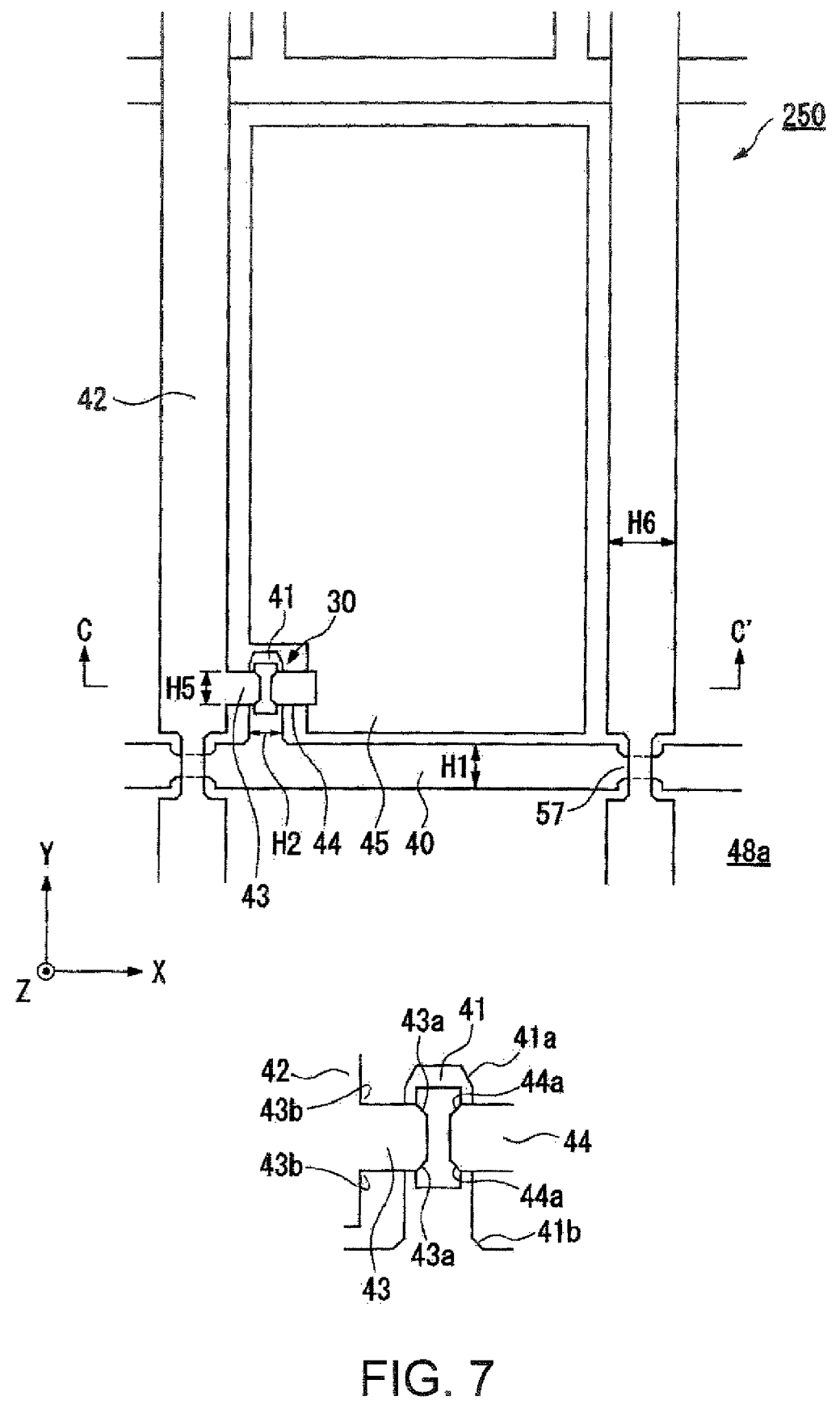

The pattern formation region P includes: a groove-like first-pattern forming region (i.e., the first opening) 55 that corresponds to a gate wiring (i.e., the first film pattern) 40 (refer to FIG. 7); and a second pattern-forming region (i.e., the second opening) 56 that is connected to the first pattern-forming region 55 at the front edge, corresponding to a gate electrode (i.e., the second film pattern) 41 (refer to FIG. 7). Here, "correspond" means that the first pattern-forming region 55 and the second pattern-forming region 56 respectively become the gate wiring and the gate electrode, by having the deposited functional fluid on those regions undergo a hardening treatment, and the like.

More specifically, as shown in FIG. 3A, the first pattern-forming region 55 is formed so as to extend in the Y-axis direction in FIG. 3A. The second pattern-forming region 56 is formed continuously to (i.e., connected to) the first pattern-forming region 55, in the direction approximately vertical to the first pattern-forming region 55 (i.e., in the X-axis direction in FIG. 3A).

The width of the second pattern-forming region 56 is narrower than the width of the first pattern-forming region 55. According to the embodiment, the width of the first pattern-forming region 55 is approximately equal to, or, slightly larger than the flying radius of the functional fluid discharged from the droplet discharge device IJ. By adopting such bank structure 1, the functional fluid discharged on the first pattern-forming region 55 flows into the minute second pattern-forming region 56 by a self-flow, resulting from a capillary phenomenon.

Here, the "width" of the first pattern-forming region 55 and of the second pattern-forming region 56 indicates a respective distance between the ends of those regions in the direction orthogonal to the directions that those regions extend (X and Y). The width of the first pattern-forming region 55 is called H1, and the width of the second pattern-forming region 56 is called H2, as shown in FIG. 7.

The second pattern-forming region 56 (or, the gate electrode 41) has a missing part 41a at its front edge, in which a corner (box) of a rectangular contour is missing. The second pattern-forming region 56 (or, the gate electrode 41) is connected to the first pattern-forming region 55 (or, the gate wiring 40) through a widened part 41b whose linear width progressively expands at its rear edge. These missing part 41a and widened part 41b are placed outside of a functional region E that performs a prescribed function, where a later-described source electrode 43 and a drain electrode 44 cross in planar form (in planar view).

Figure 3B:
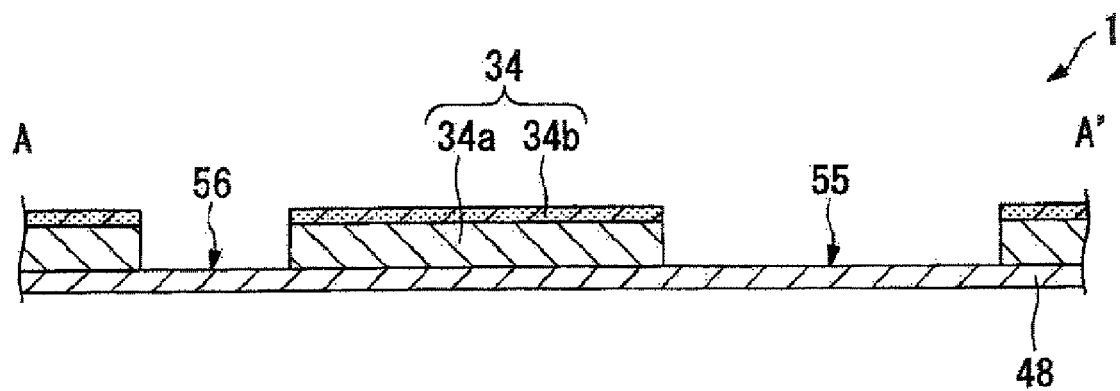
FIG. 3B is a sectional side view drawing of the FIG. 3A.

The sectional shape of the bank structure 1 at section A-A' has a composition shown in FIG. 3B. The bank structure 1 includes the multi-layered bank 34 on the substrate 48. In this embodiment, it is a 2-layer structure having a first bank layer 34a and a second bank layer 34b, in the order viewed from the substrate 48. The upper layer of the second bank layer 34b in the bank 34 is more liquid-repellent than the first bank layer 34a, while the first bank layer 34a is relatively more lyophilic than the second bank layer 34b. Hence, when the functional fluid lands on the top surface of the bank 34, it flows into the first pattern-forming region 55 and the second pattern-forming region 56 (mainly to the first pattern-forming region 55), due to the liquid-repellency of the top surface. As a result, the functional fluid desirably flows inside the first pattern-forming region 55 and the second pattern-forming region 56. Here, according to the embodiment, the first bank layer 34a has the contact angle of less than 50 degrees against the functional fluid, and the second bank layer 34b has the contact angle of at least 50 degrees against the functional fluid.

Film Pattern Forming Method

After forming the bank structure 1, a method for forming the gate wiring as a film pattern in the pattern formation region P that is partitioned by the bank structure 1, will now be described.

Figure 5A:
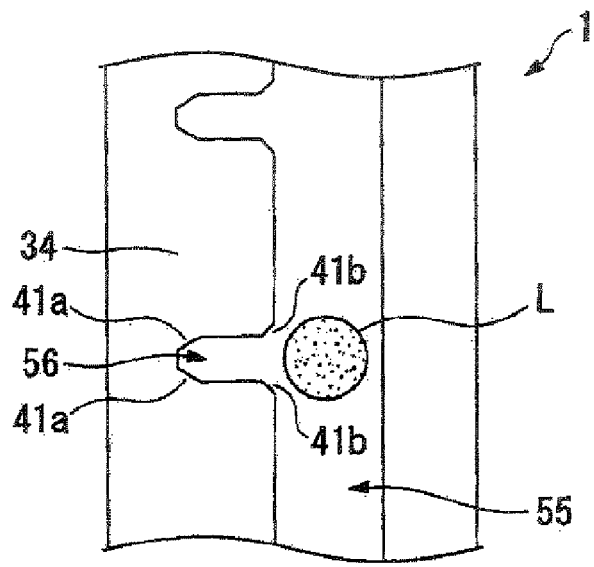
FIGS. 5A to 5C are sectional side view drawings for describing a formation process of a wiring pattern
Figure 5B:
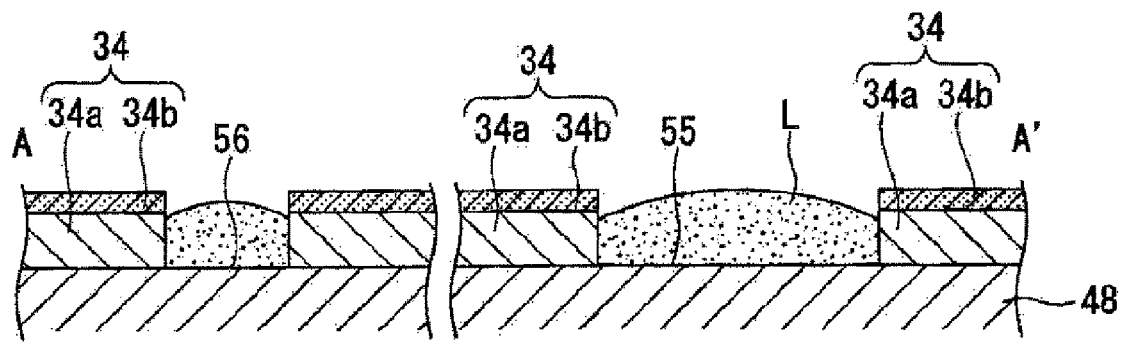
Figure 5C:
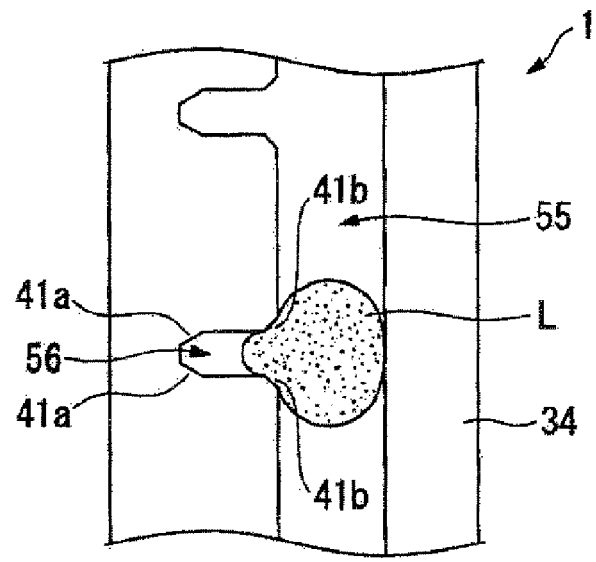

FIGS. 4A to 4D are sectional side view drawings, showing the formation process of the bank structure 1 in sequence. FIGS. 4A to 4D illustrates the process of forming the pattern formation region P that is formed including the first pattern-forming region 55 and the second pattern-forming region 56, displayed along the side section A-A' shown in FIGS. 3A. FIGS. 5A to 5C are sectional drawings describing the process of forming the film pattern (or, gate wiring), by depositing the functional fluid on the bank structure 1 formed with the manufacturing process shown in FIGS. 4A to 4D.

Bank Material Coating

As shown in FIG. 4A, a first bank layer 35a is formed by coating a first bank forming material to the whole area of the substrate 48 by spin coating (drying condition: 80° C., 60 seconds); thereafter, a second bank layer 35b is formed on the first bank layer 35a (drying condition: 80° C., 60 seconds). Here, various methods may be applied as a method of coating a substrate with the bank forming material, such as: a spray coating, roll coating, die coating, dip coating, and the like.

As the substrate 48, various materials such as glass, quartz glass, silicon wafers, plastic films, and metallic plates may be used. As for the first bank forming material, ones relatively less easier to bring about fluorination are used, such as polymers having a principal chain of siloxane bond, and having a side chain of alkyl or aryl radicals (in this embodiment, alkyl is used). In contrast, as for the second bank forming material, ones relatively easier to bring about fluorination are used, such as polymers having a principal chain of siloxane bond, and having a side chain of hydrogen, or radical of either alkenyl or alkoxyalkyl (in this embodiment, hydrogen is used). Further, on the surface of the substrate 48, an undercoat layer may be formed with films such as a semiconductor film, a metallic film, a dielectric film and an organic film.

In addition to the examples above, there may be used as for the first bank forming material, polymers having a principal chain of siloxane bond, and having a side chain of radicals such as methyl, ethyl, phenyl, tolyl, biphenyl, naphthyl. In addition to the examples above, as for the second bank forming material, there may be used polymers having a principal chain of siloxane bond, and having a side chain of —H, —OH, —(Ch2CH2O)nH, —COOH, —COOK, —COONa, —CONH2, —SO3H, —SO3Na, —SO3K, —OSO3H, —OSO3Na, —OSO3K, —PO3H2, —PO3Na2, —PO3K2, —NO2, —NH2, —NH3Cl (ammonium salt)., —NH3Br (ammonium salt), —NHCl (pyridinium salt), NHBr (pyridinium salt), and the like.

Exposure

Thereafter, as shown in FIG. 4B, the first pattern-forming region 55 and the second pattern-forming region 56 are formed, by directing the light from an aligner (not shown) through a mask M onto the first and the second bank layers 35a and 35b (hereafter, the first bank layer 35a and the second bank layer 35b may also be collectively called "a bank layer 35") that are deposited on the substrate 48. The exposed part of the bank layer 35 on which the light is directed will be resolved and removed in the development process described later. Hence, the bank structure 1 is formed having the above-referenced pattern formation region P.

Development

After the exposure process described above, the exposed bank layer 35 is developed by a developer, the one, for example, including tetramethyl ammonium hydroxide (TMAH), thereby selectively removing the exposed portion, as shown in FIG. 4C. Thereafter, as shown in FIG. 4D, by baking (300° C., 60 min.), there formed the bank structure 1 that includes the first bank layer 34a and the second bank layer 34b, both of which partition the pattern formation region P containing the first pattern-forming region 55 and the second pattern-forming region 56. Hereafter, the first bank layer 34a and the second bank layer 34b may also be collectively called "a bank 34".

Providing Liquid Repellency

After the development, the plasma processing is performed on the surface of the bank 34, using Tetrafluoromethane ($CF_4$) gas as a process gas. Examples of other process gases include a fluorine-containing gas such as $SF_5$, $CHF_3$, and the like. This plasma processing provides liquid repellency to the second bank layer 34b of the bank 34 (refer to FIGS. 4E). This is because the second bank layer 34b is made from the material relatively easier than the first bank layer 34a to bring about the fluorination.

An example of the method for providing liquid repellency includes a plasma processing ($CF_4$ plasma processing), having tetrafluoromethane as a process gas in the atmospheric air. The conditions of the $CF_4$ plasma processing are, for example, a plasma power of 50 to 1000 W (inclusive), a tetrafluoromethane gas flow rate of 50 to 100 mL/min (inclusive), a substrate transfer rate with respect to the plasma discharge electrode of 0.5 to 1020 mm/sec (inclusive), and a substrate temperature of 70 to 90 degree C. (inclusive). As the above-referenced process gas, not only tetrafluoreomethane but also other gases of fluorocvarbon type may be used.

Functional Fluid Deposition

A process for forming the gate wiring (the first film pattern) will now be described, in which the functional fluid is deposited (discharged), using the droplet discharge device IJ on the pattern formation region P formed by the bank structure 1 obtained in the above-described process. It should be noted that it is difficult to deposit the functional fluid L directly into the micro-sized wiring pattern of second pattern-forming region 56. Therefore, as described above, the deposition of the functional fluid L onto the second pattern-forming region 56 is performed by having the functional fluid L deposited on the first pattern-forming region 55 flow into the second pattern-forming region 56, utilizing the self-flow of the functional fluid L resulting from the capillary phenomenon.

First, as shown in FIG. 5A, the functional fluid L (a material for forming a wiring pattern) is discharged onto the location where the first pattern-forming region 55 faces the second pattern-forming region 56. The functional fluid L deposited on the first pattern-forming region 55 by the droplet discharge device IJ spreads out within the first pattern-forming region 55, as shown in FIGS. 5B and 5C. The functional fluid L deposited on the top surface of the bank 34 flows into the first pattern-forming region 55, being repelled from the top surface due to the liquid-repellency thereof.

Figure 6A:
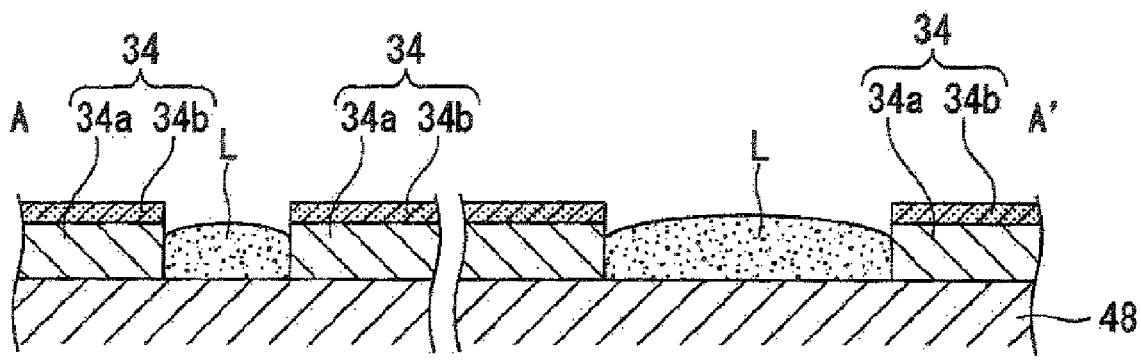
FIGS. 6A to 6C are sectional side view drawings for describing a formation process of a wiring pattern.
Figure 6B:
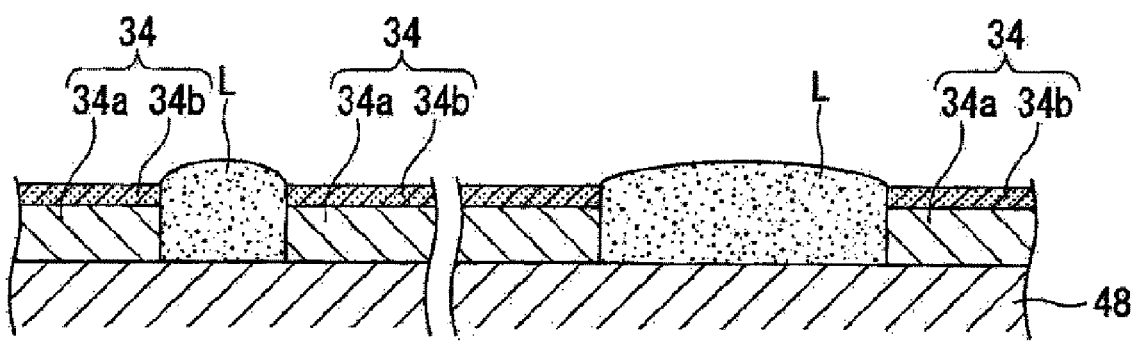
Figure 6C:
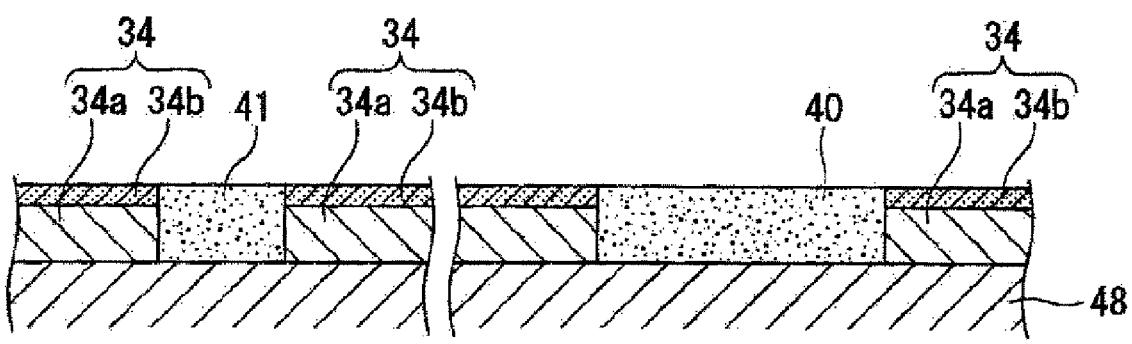

The internal surface of the bank 34 (i.e., the internal surface of the first bank layer 34a) is more lyophilic than the top surface; hence, the discharged functional fluid L flows into the entire area of the pattern formation region P, along the internal surface thereof. More specifically, as shown in FIGS. 6A to 6C, the functional fluid L evenly spreads inside the first pattern-forming region 55 and the second pattern-forming region 56.

At this time, the functional fluid L flows into the second pattern-forming region 56 with a state of reduced flow resistance, since the widened part 41b is provided to the second pattern-forming region 56 where it connects to the first pattern-forming region 55. Moreover, the functional fluid L completes its flow into the second pattern-forming region 56 in shorter time, compared to the case where the second pattern-forming region 56 is formed in rectangular contour without the missing part 41a, since the projected area (volume) of the second pattern-forming region 56 is smaller by the size of missing part 41a.

Intermediate Drying

Subsequently after depositing the functional fluid L to the first pattern-forming region 55 and the second pattern-forming region 56, a drying treatment is carried out as necessary. This ensures the removal of the dispersion medium of the functional fluid L, as well as the film thickness of the pattern.

The drying treatment can be done, for example, through various methods such as a normal hot plate, an electric furnace, and a lamp annealing that heat the substrate 48. There is no specific limitation for a light source used for lamp annealing. An infrared lamp, a xenon lamp, a YAG laer, an argon laser, a carbonic acid gas laser, excimer lasers such as XeF, XeCl, XeBr, KrF, KrCl, ArF, and ArCl may be used as the light source. These light sources, their output ranging from 10 W to 5000 W (inclusive) are generally used. In the embodiment, a range from 100 W to 1000 W (inclusive) is sufficient. In order to obtain a desired film thickness, the functional fluid deposition may be repeated as necessary after the intermediate drying.

Baking

If the electrical conductive material of the functional fluid L is, for example, an organic silver compound, then it is necessary to conduct a heat treatment so as to remove the organic component and to have the silver particles to remain, in order to provide electrical conductivity after the functional fluid L deposition. Accordingly, it is desirable to administer a heat treatment or an optical processing to the substrate after the deposition of the functional fluid L.

While the heat treatment and/or the optical processing is normally conducted in the atmosphere, it may also be carried out, as necessary, in an inert gas atmosphere such as nitrogen, argon, and helium, or, in hydrogen. The treating temperature of the heat treatment and/or the optical processing is determined appropriately, considering: a boiling point (steam pressure) of the disperse medium; type and pressure of the atmosphere gas; thermal behavior such as dispersibility and oxidizability of the minute particles or of the organic silver compound; presence and quantity of a coating material, heat-resisting temperature of the substrate, and the like. For instance, in order to remove the organic component of the organic silver compound, the baking needs to be carried out at a temperature of 200° C. and/or more (in the embodiment, 60 minutes at 300° C.). Moreover, in case of using a substrate such as plastics, it is desirable to carry out this process at the temperature between room temperature and 100° C. (inclusive).

Resulting from the processes described above, the silver particles, being the conductive material (organic silver compound) of the functional fluid L, remain, and are converted to a conductive film. Thereby, as shown in FIG. 6C, a continuous conductive film pattern with hardly any difference in film thicknesses, are obtained. In other words, the first film pattern 40 that performs as the gate wiring and the second film pattern 41 that performs as the gate electrode are obtained. When there is hardly any difference in film thicknesses between that of the gate wiring and that of the gate electrode, the transistor characteristics is stabilized.

Figure 9A:
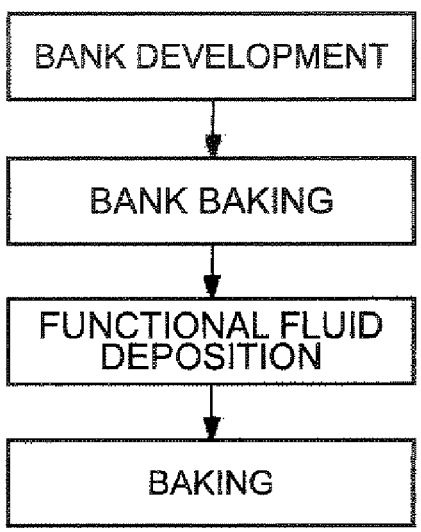
FIGS. 9A and 9B are explanatory drawings indicating several examples of a baking process.
Figure 9B:
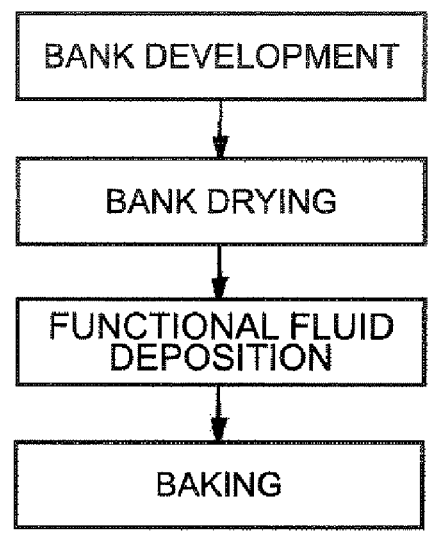

In the embodiment, as shown in FIG. 9A, after the development of the bank layer 35, the baking is performed on the formed bank 34, thereafter the functional fluid is deposited, followed by the drying and the baking of the functional fluid. Instead, as shown in FIGS. 9B for instance, after the development of the bank layer 35, the drying may also be performed on the formed bank 34, thereafter depositing the functional fluid, followed by the simultaneous baking of the formed wiring and of the above-referenced bank after the drying of the functional fluid.

As described, in this embodiment, the flow length of the functional fluid L in the second pattern-forming region 56 is shortened by the missing part 41a; hence the stable formation of the gate wiring 40 and the gate electrode 41 is achieved. Further, in this embodiment, the widened part 41b reduces the flow resistance of the functional fluid L when it flows into the second pattern-forming region 56; thus the functional fluid L flows more smoothly, contributing to a further stable formation of the film pattern. Still further, in the embodiment, the missing part 41a and the widened part 41b are placed outside of a functional region E, thereby realizing a stable patterning without impairing the performance as a TFT.

Device

A device including the film pattern formed by the film pattern forming method according to the embodiment of the invention will now be described. In the embodiment, a pixel (device) having a gate wiring and the method for forming such pixel are described with references to the FIGS. 7 and FIGS. 8A to 8E.

In the embodiment, there formed a pixel for a bottom gate TFT30 having a gate electrode, a source electrode, and a drain electrode, utilizing the method for forming the above-referenced bank structure and the film pattern. Hereafter, the description is omitted for the processes that are similar to the film pattern forming processes shown in FIGS. 5A to 5C and FIGS. 6A to 6C. Moreover the same signs and numerals are used for common constituent elements shown in the above-described embodiment.

Structure of Pixel

A structure of a pixel (device) including the film pattern formed by the above-described film pattern forming method will now be described.

FIG. 7 is a drawing showing a pixel structure 250 according to the embodiment.

As shown in FIG. 7, on the substrate 48, the pixel structure 250 includes: the gate wiring 40 (the first film pattern); the gate electrode 41 (the second film pattern) formed extending out from the gate wiring 40; a source wiring 42; a source electrode 43 formed extending out from the source wiring 42; a drain electrode 44; and a pixel electrode 45 electrically connected to the drain electrode 44. The gate wiring 40 is formed extending in the X-axis direction, and the source wiring 42 is formed extending in the Y-axis direction. In the vicinity of the crossing point of the gate wiring 40 and the source wiring 42, the TFT30, which is a switching device, is formed. A drive current is supplied to the pixel electrode 45 connected to the TFT, when the TFT30 is switched on.

A width H2 of the gate electrode 41 is formed to be narrower than a width H1 of the gate wiring 40, as shown in FIGS. 7. For example, the width H2 of the gate electrode 41 is 10 μm, and the width H1 of the gate wiring 40 is 20 μm. The gate wiring 40 and the gate electrode 41 are formed in accordance with the above-described embodiment.

A width H5 of the source electrode 43 is formed to be narrower than a width H6 of the source wiring 42. For example, the width H5 of the source electrode 43 is 10 μm, and the width H6 of the source wiring 42 is 20 μm. In this embodiment, the electrodes are formed, by applying the film pattern forming method described above, having the functional fluid flow into the minute pattern of the source electrode 43, utilizing a capillary phenomenon. Similar to the gate electrode 41, the source electrode 43 is provided with a missing part 43a at its front edge, as well as with a widened part 43b at its rear edge in the vicinity of connecting part with the source wiring 42. This allows the stable pattern formation. Moreover, a missing part 44a is provided at the front edge in the drain electrode 44, so that the flow length will be short.

Further, as shown in FIG. 7, a cramped part 57, in which the wiring width is narrower than the other region, is provided in the part of the gate wiring 40. Over the cramped part 57, a similar cramped part is provided in the source wiring 42 where it crosses the gate wiring 40. Herewith, the charge accumulation at the crossing point between the gate wiring 40 and the source wiring 42 is prevented by forming their wiring widths narrow A widened part is provided to where each cramped part 57 connects to the gate wiring 40 and to the source wiring 42, reducing the flow resistance of the functional fluid flowing into the cramped part 57 from the gate wiring 40 and from the source wiring 42. Hence, the pattern is stably formed Pixel Forming Method FIG. 8A to 8E are sectional drawings showing a formation process of the pixel structure 250 at section C-C' shown in FIG. 7.

Figure 8A:
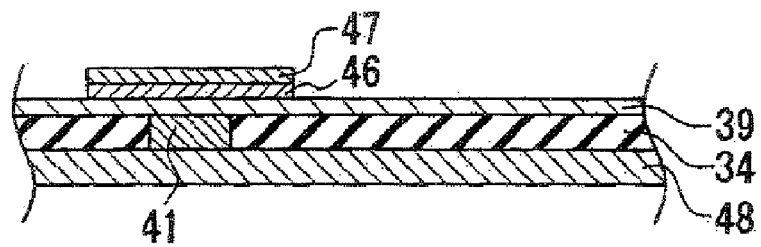
FIGS. 8A to 8E are sectional drawings indicating a formation process of one pixel.

As shown in FIG. 8A, a gate insulation film 39 is deposited, with a plasma chemical vapor deposition and the like, on the bank 34 that includes the gate electrode 41 formed with the method described above. Here, the gate insulation film 39 is formed with silicon nitride. Thereafter, an active layer is deposited on the gate insulation film 39.

Subsequently, an amorphous silicon film 46 is formed by patterning a film in a predetermined pattern, as shown in FIG. 8A, with photolithography and etching.

Thereafter, a contact layer 47 is deposited on the amorphous silicon film 46. Subsequently, a predetermined pattern is patterned, as shown in FIG. 8A, with photolithography and etching. The contact layer 47 is formed from an n+ type silicon film, by changing the raw material gas or a plasma condition.

Figure 8B:
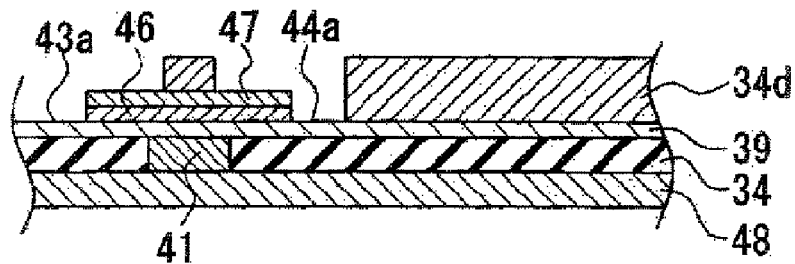

Thereafter, as shown in FIG. 8B, a bank material is coated on the entire surface including the contact layer 47 with spin coating and the like. Since the material used for the bank needs to have light transparency and liquid repellency after its formation, polymer materials such as acrylic resin, polyimide resin, olefin resin, and melamine resin are suitably used. In consideration of heat-resistance and transmission, polysilazane, which has an inorganic skeleton, is desirably used. The $CF_4$ plasma processing or the like is carried out in order to provide the liquid repellency to the bank material, the processing being a plasma processing using the gas that contains fluorine component. Alternatively, it is desirable to fill in a liquid repellent component, such as fluorine radicals, into the bank material in advance. In this case, the $CF_4$ plasma processing and the like may be omitted.

Thereafter, a source-drain electrode bank 34d is formed, having the size ranging from one-twentieth to one-tenth (inclusive) of one pixel pitch. Specifically, a source electrode forming region 43 is formed at the location on the gate insulation film 39, where the coated bank 34 corresponds to the source electrode 43. Similarly, a drain electrode forming region 44 is formed at the location corresponding to the drain electrode 44. At this time, similar to the first embodiment, the height of the internal side surface of the bank that partitions the source electrode forming region 43 is lower than the height of the internal side surface of the bank that partitions the source wiring forming region that corresponds to the source wiring 42 (not shown).

Thereby prevented is the occurrence of difference in film thicknesses between the source wiring 42 and the source electrode 43.

Figure 8C:
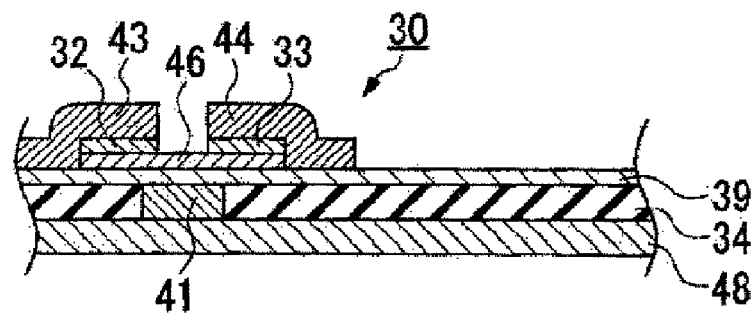

Thereafter, the functional fluid L is deposited to the source electrode forming region 43 and the drain electrode forming region 44a, being partitioned by the source-drain electrode bank 34d; thereby the source electrode 43 and the drain electrode 44 are formed. Specifically, the functional fluid L is deposited to the source wiring forming region by the droplet discharge device IJ (figure omitted). As shown in FIGS. 7, the width H5 of the source electrode forming region 43 is formed to be narrower than the width H6 of the groove for the source wiring. Therefore, the functional fluid L deposited on the groove for source wiring is tentatively blocked by the cramped part provided in the source wiring, and it flows into the source electrode forming region 43 resulting from the capillary phenomenon. At this time, by employing the film pattern forming method according to the embodiment of the invention, thereby approximately eliminated is the difference of the film thickness between the source wiring 42 and the source electrode 43. Consequently, the source electrode 43 is formed as shown in FIG. 8C. The drain electrode 44 is formed by discharging the functional liquid to the drain electrode forming region (not shown).

Thereafter, a source-drain electrode bank 34d is removed, after forming the source electrode 43 and the drain electrode 44, as shown in FIG. 8C. Then the n+ type silicon film of the contact layer 47 is etched, using as a mask the source electrode 43 and the drain electrode 44 that remained on the contact layer 47, the silicon film being formed between the source electrode 43 and the drain electrode 44.

The etching removes the n+ type silicon film of the contact layer 47, formed between the source electrode 43 and the drain electrode 44, and part of the amorphous silicon film 46, formed under the n+ type silicon film, is exposed. Consequently, a source region 32 being formed of n+ silicon is formed in a layer beneath the source electrode 43, and, a drain region 33 being formed of n+ silicon is formed in a layer beneath the drain electrode 44. Moreover, a channel region (the amorphous silicon film 46) formed of amorphous silicon is formed in a layer beneath the source region 32 and the drain region 33.

The bottom gate TFT 30 is thereby formed with the above-described process.

As described, by utilizing the pattern forming method according to the embodiment, the film thickness of the gate wiring 40 coincides with that of the gate electrode 41, and, the source wiring 42 and the source electrode 43 are made in the same film thickness. Consequently, the transistor characteristic is stabilized, and the pixel provided with this transistor has high reliability.

Figure 8D:
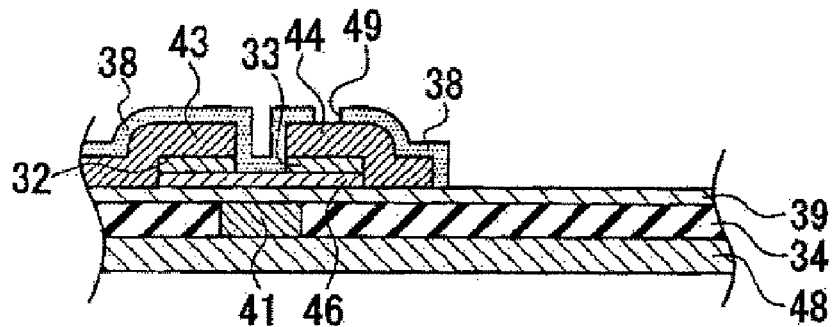

Thereafter, a passivation film 38 (protection film) is deposited on the source electrode 43, the drain electrode 44, the source region 32, the drain region 33, and on the exposed silicon layer, with methods such as vapor deposition and sputtering as shown in FIG. 8D. Subsequently, the passivation film 38 is removed with photolithography and etching, the film being on the gate insulation film 39 on which the pixel electrode 45 (described later) will be formed. At the same time, in order to electrically connect the pixel electrode 45 and the source electrode 43, a contact hole 49 is formed in the passivation film 38 on the drain electrode 44.

Figure 8E:
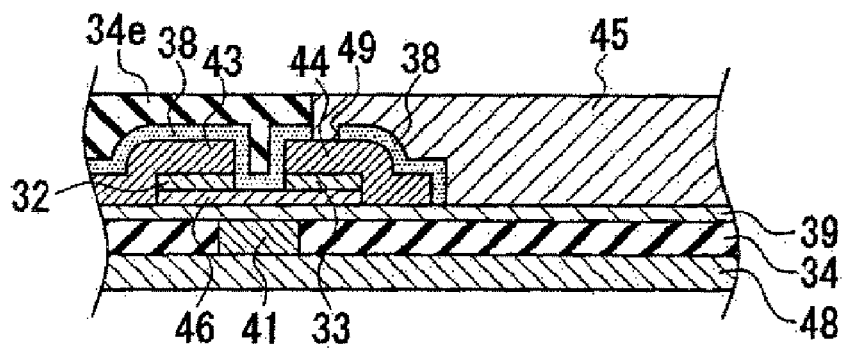

Thereafter, as shown in FIG. 8E, the bank material is coated on the region including the gate insulation film 39 on which the pixel electrode 45 is formed. Here, the bank material includes, as described, materials such as acrylic resin, polyimide resin, olefin resin, and melamine resin. Subsequently, a liquid repellent treatment is carried out on the top surface of the bank workpiece (a pixel electrode bank 34e) with plasma processing or the like. Thereafter, the pixel electrode bank 34e is formed with photolithography, the bank being a region in which the pixel electrode 45 is formed.

Thereafter, the pixel electrode 45 formed of indium tin oxide (ITO) is formed in the region portioned into the pixel electrode bank 34e, with method such as an inkjet, or a vapor deposition. The electric connection between the pixel electrode 45 and the drain electrode 44 is ensured by filling the pixel electrode 45 into the contact hole 49. In this embodiment, the liquid repellent treatment is carried out on the top surface of the pixel electrode bank 34e, and, lyophilic treatment is carried out to the groove for the pixel electrode. Consequently, the pixel electrode 45 is formed without it protruding from the groove for the pixel electrode.

As described in the above processes, the pixel according to the embodiment shown in FIG. 7 is formed.

Electro-optical Device

The liquid crystal display device will now be described, the device being an example of the electro-optical device according to the embodiments of the invention, and including the pixel formed by the film pattern forming method, having the above-referenced bank structure.

Figure 10:
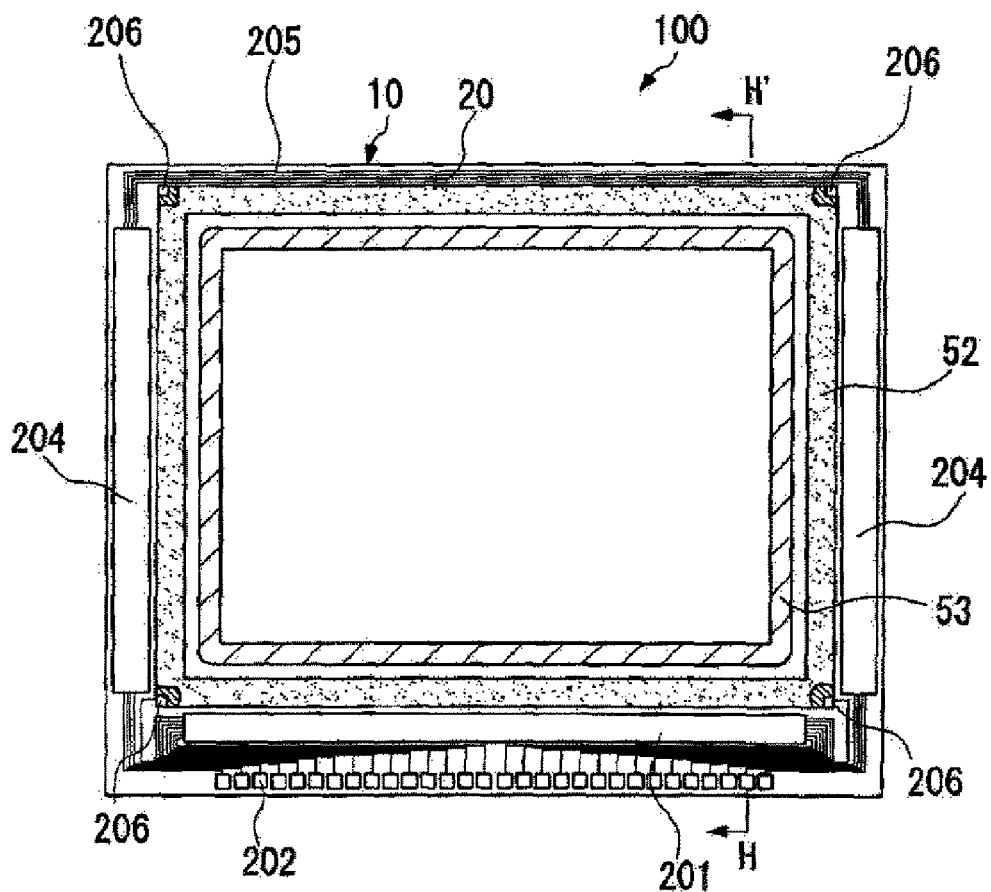
FIG. 10 is a top view drawing of a liquid crystal display device viewed from a counter substrate.
Figure 11:
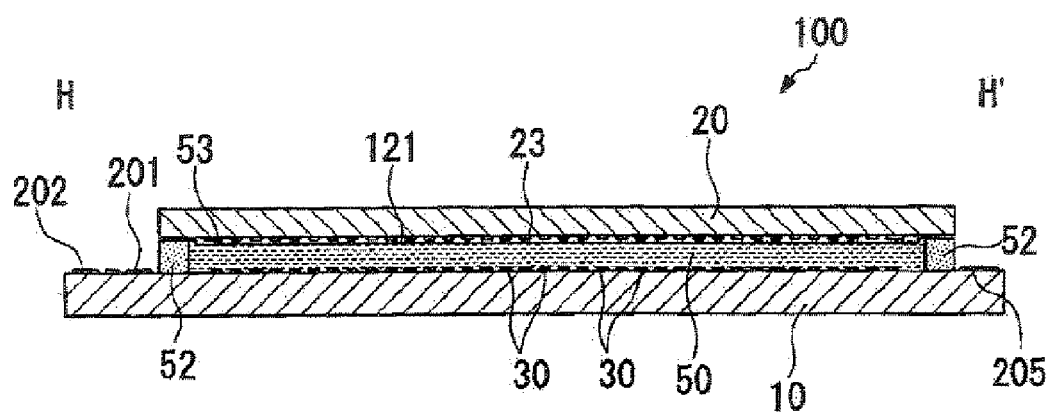
FIG. 11 is a sectional drawing of a section H-H' in FIG. 10.
Figure 12:
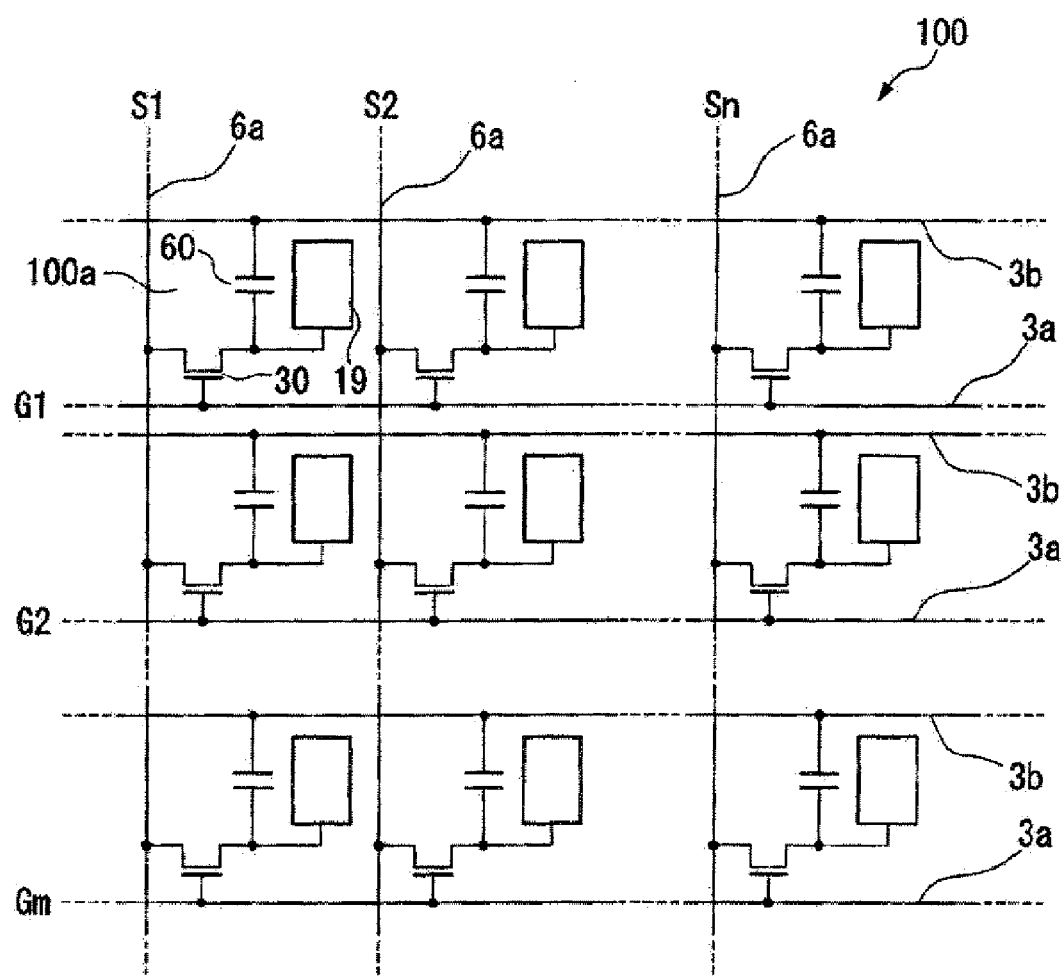
FIG. 12 is an equivalent circuit schematic of a liquid crystal display device.

FIG. 10 is a top view drawing of a liquid crystal display device according to the embodiment of the invention, viewed, including its components, from a counter substrate. FIG. 11 is a sectional drawing of a section H-H' in FIG. 10. FIG. 12 is an equivalent circuit schematic of devices, wirings and the like in a plurality of pixels formed in matrix in an image display area of a liquid crystal display device. Figures shown hereafter have different scale size for each of the layers and components, so that each of them will have a size large enough to be recognized in the figures.

In FIGS. 10 and 11, a liquid crystal display device (electro-optical device) 100 is such that a pair of substrates, a TFT array substrate 10 and a counter substrate 20, are adhered together by a sealant 52, the sealant being a optical hardening sealant. Liquid crystal 50 is sealed and held within regions partitioned by the sealant 52.

A peripheral partition 53 made of opaque material is formed in the inside of the region surrounded by the sealant 52. A data line drive circuit 201 and mounted terminals 202 are formed along one side of the TFT array substrate 10 on the area outside the sealant 52. Along two sides touching adjacently to this side, scanning line drive circuits 204 is formed. At the remaining side of the TFT array substrate 10, there are installed a plurality of wirings 205 for a connection between the scanning line drive circuits 204 installed on both sides of the image display area. Further, in at least one of the corners of the counter substrate 20, there is disposed an inter-substrate continuity material 206 to provide electrical continuity between the TFT array substrate 10 and the counter substrate 20.

Instead of forming a data line drive circuit 201 and a scanning line drive circuit 204 on the TFT array substrate 10, electrical and mechanical connections may be made between, for example, a tape automated bonding (TAB) substrate mounted with an LSI for drive, and a group of terminals formed in the periphery of the TFT array substrate 10, through an anisotropic conductive film. In the liquid crystal display device 100, a phase difference plate, polarization plate and the like are arranged in a prescribed direction, depending on the kind of liquid crystal 50 to be used, that is, operating mode such as twisted nematic (TN) mode, compensated TN (C-TN) mode, vertical alignment (VA) mode, in-place-switching (IPS) mode, or, mode such as normally white mode or normally black mode. Illustrations are omitted.

Further, if the liquid crystal display device 100 is for color display, red (R), green (G), and blue (B) color filters for instance, are formed in the counter substrate 20 along with their protective film, in an area opposite to each pixel electrode (described later) of the TFT array substrate 10.

In the image display area of the liquid crystal display device 100 having such structure, as shown in FIG. 12, a plurality of pixels 100a are constituted in matrix. At the same time, in each of the pixels 100a, the TFT (switching device) 30 is formed for pixel switching, and each of the data lines 6a supplying pixel signals S1, S2 . . . Sn is electrically connected to TFT 30 source. Pixel signals S1, S2 . . . Sn to be written in the data lines 6a may be supplied in this order, in line sequence, or, may also be supplied to the plurality of the data lines 6a being mutually adjacent, in groups. Further, scanning lines 3a are electrically connected to TFT 30 gates, where, at a prescribed timing, scanning signals G1, G2 . . . Gm are impressed on the scanning lines 3a in pulse in this order of line sequence.

Pixel electrodes 19 are electrically connected to the TFT 30 drains, and by switching on the TET 30 (switching device) only for a prescribed period, write-in pixel signals S1, S2 . . . Sn supplied from the data lines 6a to each pixel in a prescribed timing. In this manner, the pixel signals S1, S2 . . . Sn are written-in, being at the prescribed level, to the liquid crystals through the pixel electrodes 19, and are held for a prescribed period of time, in a space sandwiched by counter electrodes 121 of the counter substrate 20, as shown in FIG. 11 In order to prevent the leak of the held pixel signals S1, S2 . . . Sn, accumulation capacities 60 are added, in parallel to liquid crystal capacities formed between the pixel electrodes 19 and the counter electrodes 121. For example, voltages of the pixel electrodes 19 are held in the accumulation capacities 60 for a period of time longer by three digits than the period of time source voltages are impressed. Consequently, a holding characteristics of charges is improved, and the liquid crystal display device 100 with higher contrast ratio is realized.

Figure 13:
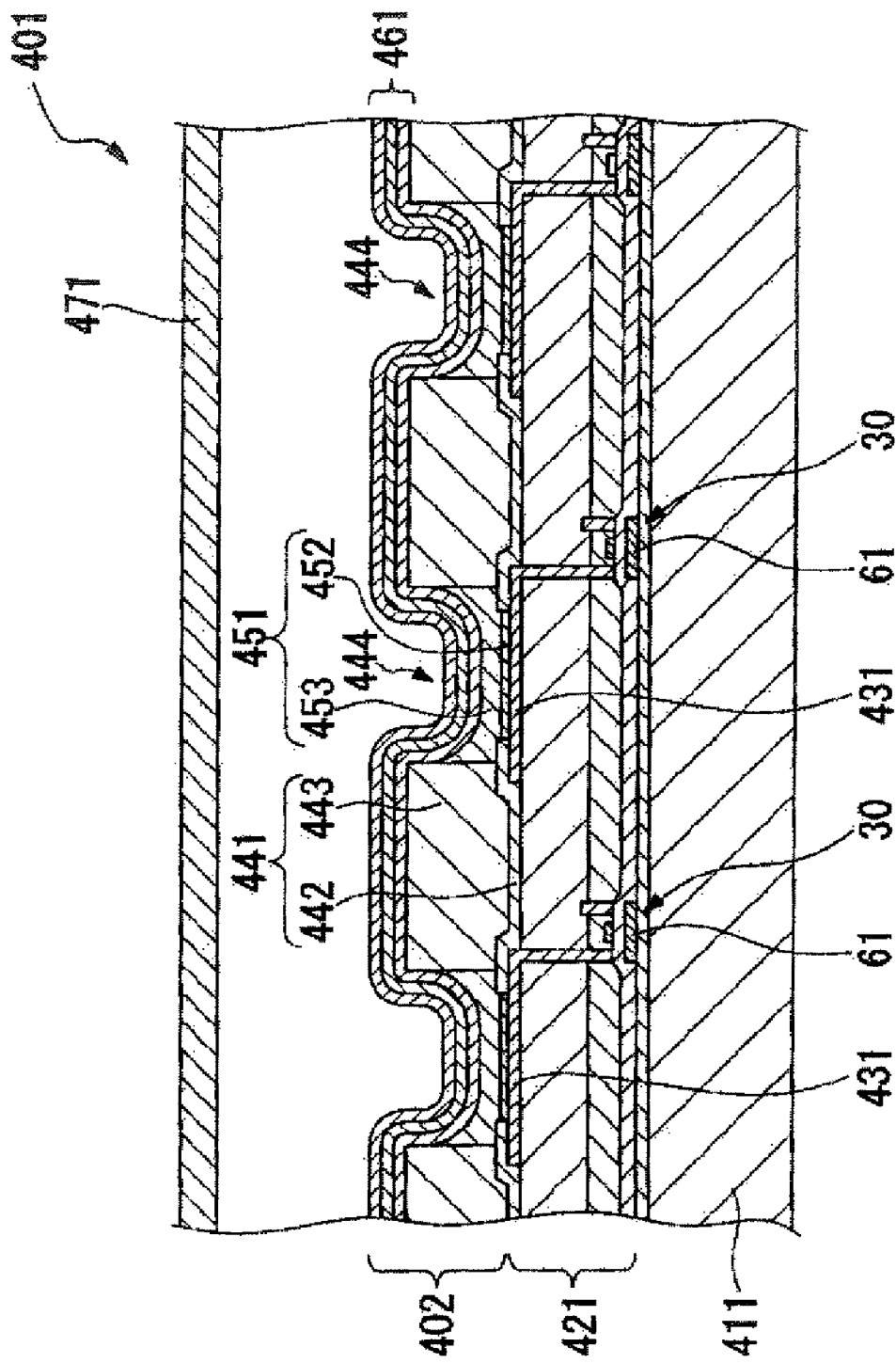
FIG. 13 is a magnified partial drawing of an organic EL device.

FIG. 13 is a sectional side view drawing of an organic EL device including the pixel formed by the pattern forming method, having the above-referenced bank structure. Hereafter, the skeletal structure of the organic EL device is described with reference to FIG. 13.

An organic EL device (electro-optical device) 401 includes an organic EL device 402 having: a substrate 411, circuit device units 421, pixel electrodes 431, banks 441, light-emitting devices 451, cathodes 461 (counter electrodes), and a sealing substrate 471. The organic EL device 401 also has a wiring of a flexible substrate (not shown) and a driving integrated circuit (IC, not shown), connected to the organic EL device 402. The circuit device unit 421 has a structure, where the TFTs 60 (active elements) are formed on the substrate 411, and the plurality of pixel electrodes 431 is aligned on the circuit device unit 421. Gate wirings 61 that constitute the TFTs 60 are formed with the wiring pattern forming method according to the above-described embodiment.

The banks 441 are formed in a reticular pattern in between the pixel electrodes 431, and light-emitting devices 451 are formed at concave openings 444 produced by the banks 441. The light-emitting devices 451 include elements emitting red, green, or blue light; thereby, the organic EL device 401 is displayed in full color. The cathodes 461 are formed on the entire top surfaces of the banks 441 and the light-emitting devices 451, on which the sealing substrate 471 is laminated.

manufacturing process of the organic EL device 401 having the organic EL devices includes: a bank formation process for forming the banks 441; a plasma processing process for properly forming the light-emitting devices 451; a light-emitting device formation process for forming the light-emitting devices 451; a counter electrode formation process for forming cathodes 461; and a sealing process for laminating and sealing the sealing substrate 471 on the cathodes 461.

In the light-emitting device formation process, having a hole injection formation process and a light-emitting layer formation process, the light-emitting devices 451 are formed by layering hole injection layers 452 and light-emitting layers 453 on the concave openings 444, in other words, on the pixel electrodes 431. In the hole injection formation process, there are a first discharge process and a first drying process, whereas the first discharge process is for discharging the liquid material for forming the hole injection layers 452 on the pixel electrodes 431, and the first drying process is for drying the discharged liquid material as well as for forming the hole injection layers 452. In the light-emitting layer formation process, there are a second discharge process and a second drying process, whereas the second discharge process is for discharging the liquid material for forming the light-emitting layers 453 on the hole injection layers 452, and the second drying process is for drying the discharged liquid material as well as for forming the light-emitting layers 453. The second discharge process has three steps, since the light-emitting layers 453 are formed to have three variations according to the materials corresponding to three colors of red, green, and blue, so that the three kinds of materials are discharged separately.

In the light-emitting device formation process, the droplet discharge device IJ may be used for the first discharge process of the hole injection formation process and for the second discharge process of light-emitting layer formation process Thereby, a highly uniform film pattern is obtained even in the case of having a minute film pattern.

The electro-optical device according to this aspect of the invention includes the device having an electric characteristic of a high precision; hence the electro-optical device with improved performance and quality is realized.

The electro-optical device according to the embodiments of the invention may be applied to, beside the above, devices such as a plasma display panel (PDP), and a surface-conduction electron-emitter that utilizes a phenomenon of electron-emission when flowing current in parallel to a small-area thin film formed on a substrate.

Electronic Apparatus

The electronic apparatus according to the embodiment of the present invention will now be described.

Figure 14:
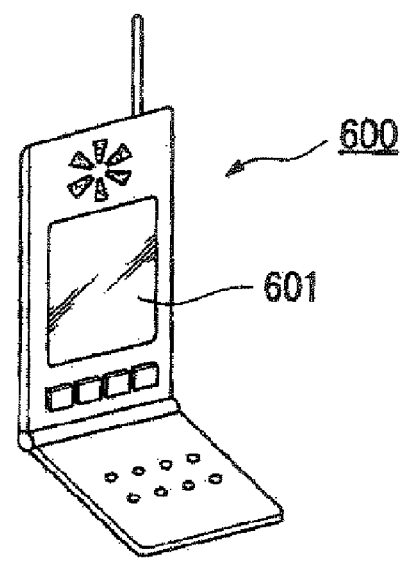
FIG. 14 is a drawing showing examples of an electronic apparatus in accordance with one aspect of the invention.

FIGS. 14 is an oblique drawing showing an example of a mobile phone. In FIG. 14, an item 600 indicates a body of the mobile phone (electronic apparatus), and an item 601 indicates a liquid crystal display unit provided with a liquid crystal display device according to the above-described embodiments.

The electronic apparatus shown in FIG. 14 includes a liquid crystal display device formed with the method for forming a pattern having the bank structure according to the above-described embodiment. Hence, the apparatus is provided with improved performance and quality.

The electronic apparatus according to the embodiment includes a liquid crystal device, whereas other electro-optical devices such as organic electroluminescence display and plasma display may also be included therein.

Other various applications of the electronic apparatus, beside the above-described electronic apparatus, includes, for instance, a liquid crystal projector, a personal computer (PC) and engineering workstation (EWS) that support multimedia, a pager, a word processor, a television, a viewfinder type or a direct-view monitor type video tape recorder, an electronic notebook, calculator, a car navigation device, a point-of-sale terminal, and a device having a touch panel.

While preferred embodiments according to the invention have been described with reference to appended drawings, it goes without saying that the invention is not limited thereto. Various shapes, combinations and the like of each constituting member shown in the above-referenced examples are merely the examples, and therefore may be variously changed and modified, based on design requirements without departing from the scope of the invention.

For instance, in the above embodiments, the missing parts 41a, 43a, and 44a, in which a corner of a rectangular contour is missing, are provided to the front edges of the gate electrode 41, the source electrode 43, and the drain electrode 44. However, the shape of the missing part is not limited to the above, and may also include other shapes, based on the flow characteristics of the functional fluid L. For example, if the lyophilic characteristics of a side surface in the second pattern-forming region 56 (a surface that contacts the bank 34 at both sides in the direction of width) is different from that of the bottom surface (a surface of the substrate 48), there will be a deviation in flow speed between the functional fluid that contacts the side surface and the one that contacts the bottom surface. Thus, it is preferable that the shape of the missing part be set corresponding to the flow speed deviation.

Figure 15A:
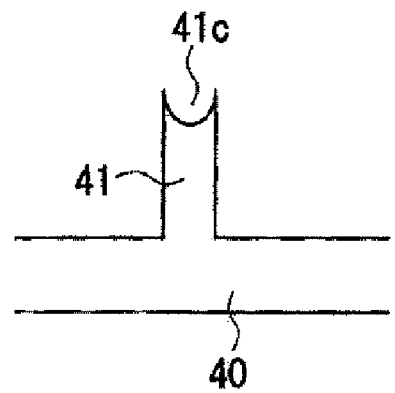
FIGS. 15A and 15B are a drawing showing other shapes of a missing part.
Figure 15B:
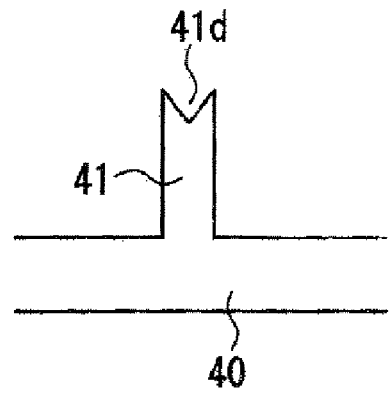

Specifically, if the side surface is less lyophilic than the bottom surface, then the flow speed of the center part in the width direction is faster compared to the side, and the front end of the liquid protrudes in the flow direction. Therefore, a corner-cut shape is preferable. Contrary, if the side surface is more lyophilic than the bottom surface, then there occurs a speed deviation, where the flow speed of the center part in the width direction is slower compared to the side, forming a contour in which the liquid protrudes at both sides, rather than at the center, to the frontal direction of the flow. Hence, as shown in FIG. 15A, it is preferable to form the missing part 41c that has larger missing volume at the center in the width direction than both sides. In this case, besides the missing part 41c whose contour is formed in a curved line, a missing part 41d whose contour is formed in a straight line may be formed.

What is claimed is:

1. A method for forming a film pattern comprising:
    forming partition walls on a substrate, the partition walls defining a linear first film pattern having a first width and a plurality of second film patterns that each extend perpendicular to the first film pattern in plan view and each have a second width;
    disposing a functional fluid on the substrate between the partition walls that define the first film pattern to form the first film pattern; and
    flowing the functional fluid along the substrate from the first film pattern to regions between the partition walls that form the second film pattern,
    wherein the second widths of the second film patterns are less than the first width of the first film pattern;
    the second film patterns are each connected to the first film pattern at a rear edge thereof that is located proximate the first film pattern; and
    front edges of the second film patterns are located distal to the first film pattern, and each front edge has a missing part in which a corner of a rectangular contour is missing such that the missing part of each front edge is located distal from the first film pattern.

2. The method for forming a film pattern according to claim 1, wherein the missing part is shaped based on the rheological characteristics of the functional fluid.

3. The method for forming a film pattern according to claim 1, wherein the missing part is formed outside of a functional region in the second film pattern.

4. The method for forming a film pattern according to claim 1, wherein the front edge of the second film pattern is connected to the first film pattern via a widened part in which the second width expands.

* * * * *